(12) United States Patent
Nomaru

(10) Patent No.: US 12,264,908 B2
(45) Date of Patent: Apr. 1, 2025

(54) MEASURING APPARATUS

(71) Applicant: DISCO CORPORATION, Tokyo (JP)

(72) Inventor: Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 133 days.

(21) Appl. No.: 18/147,072

(22) Filed: Dec. 28, 2022

(65) Prior Publication Data

US 2023/0213331 A1 Jul. 6, 2023

(30) Foreign Application Priority Data

Jan. 6, 2022 (JP) .................................. 2022-001070

(51) Int. Cl.
| | | |
|---|---|---|
| *G01B 11/06* | (2006.01) | |
| *G01B 11/03* | (2006.01) | |
| *H01L 21/66* | (2006.01) | |

(52) U.S. Cl.
CPC .......... *G01B 11/0608* (2013.01); *G01B 11/03* (2013.01); *G01B 11/06* (2013.01); *G01B 11/0625* (2013.01); *G01B 11/0675* (2013.01); *H01L 22/12* (2013.01); *G01B 2210/56* (2013.01)

(58) Field of Classification Search
CPC ..... G01B 11/0608; G01B 11/03; G01B 11/06; G01B 11/0625; G01B 11/0675; G01B 2210/56; H01L 22/12
USPC ........................................................ 356/503
See application file for complete search history.

(56) References Cited

U.S. PATENT DOCUMENTS

| | | | | |
|---|---|---|---|---|
| 5,387,309 A | * | 2/1995 | Bobel ................ | G01B 11/0675 118/712 |
| 2004/0257583 A1 | * | 12/2004 | Kim .................... | G01B 11/0625 356/504 |
| 2012/0044501 A1 | * | 2/2012 | Oikaze ................ | G01B 11/0675 356/503 |
| 2012/0281233 A1 | * | 11/2012 | Yuki .................. | G01B 11/0608 356/477 |
| 2015/0285619 A1 | * | 10/2015 | Motohashi ........... | G01B 9/0203 356/503 |
| 2019/0074221 A1 | * | 3/2019 | Nomaru ............... | B23K 26/352 |
| 2020/0096318 A1 | * | 3/2020 | Kimura .................. | G01B 11/06 |

(Continued)

FOREIGN PATENT DOCUMENTS

| | | | | |
|---|---|---|---|---|
| JP | H08338709 A | * | 12/1996 | ............. G01B 11/06 |
| JP | 3734773 B2 | * | 1/2006 | ......... H01L 21/3065 |

(Continued)

*Primary Examiner* — Michelle M Iacoletti
*Assistant Examiner* — Noah J. Haney
(74) *Attorney, Agent, or Firm* — Greer Burns & Crain Ltd.

(57) ABSTRACT

A measuring unit of a measuring apparatus includes a light source that emits light in a predetermined wavelength region, a condenser lens that applies the light emitted by the light source, to a plate-shaped workpiece held by a chuck table, a collimating lens that forms return light reflected by the plate-shaped workpiece into parallel light, a transmission filter that transmits interference light of the return light formed into the parallel light, a sensor that has coordinates for receiving the interference light transmitted through the transmission filter and detecting light intensity, and a controller that determines a coordinate position at which the light intensity detected by the sensor is high, as the thickness or height of the plate-shaped workpiece.

4 Claims, 4 Drawing Sheets

(56) References Cited

U.S. PATENT DOCUMENTS

2020/0208963 A1* 7/2020 Kimura ................ G01B 11/06
2020/0217641 A1* 7/2020 Kimura ................ G02B 27/14

FOREIGN PATENT DOCUMENTS

| JP | 2011122894 A | | 6/2011 | |
|----|--------------|---|--------|---|
| JP | 2012021916 A | | 2/2012 | |
| JP | 2013072796 A | * | 4/2013 | ............. G01B 11/02 |
| WO | WO-2014196401 A1 | * | 12/2014 | ......... G01B 11/0625 |

* cited by examiner

MEASURING APPARATUS

BACKGROUND OF THE INVENTION

Field of the Invention

The present invention relates to a measuring apparatus for measuring the thickness or the height of a plate-shaped workpiece.

Description of the Related Art

A wafer formed on its front surface with a plurality of devices such as integrated circuits (ICs) and large-scale integration (LSI) circuits partitioned by a plurality of intersecting planned dividing lines (streets) has its back surface ground by a grinding apparatus to be thinned, and is thereafter divided into individual device chips by a dicing apparatus or a laser processing apparatus, and the thus divided device chips are used for electric apparatuses such as mobile phones and personal computers.

The grinding apparatus for grinding the back surface of the wafer in general includes a chuck table that holds the wafer, a grinding unit including, in a rotatable manner, a grinding wheel for grinding the wafer held by the chuck table, and a measuring unit that measures the thickness of the wafer held by the chuck table, and is capable of processing the wafer to a desired thickness.

When a contact type measuring unit that measures the thickness of the wafer by putting a prober into contact with the ground surface of the wafer is adopted as a measuring unit of the above-mentioned grinding apparatus, the ground surface may be damaged. In recent years, therefore, a non-contact type measuring unit that measures the thickness of the wafer according to a spectral interference waveform of light reflected from the ground surface (upper surface) of the wafer and light transmitted through the wafer and reflected from a reflection surface (lower surface) of the wafer has been adopted (refer to, for example, Japanese Patent Laid-open No. 2012-021916).

In addition, also in the case of applying a laser beam of such a wavelength as to be transmitted through a wafer to the wafer, with the focal point of the laser beam positioned inside the wafer, to form modified layers in the inside of the wafer, a non-contact type measuring unit that measures the thickness of the wafer according to a spectral interference waveform of light reflected from the upper surface of the wafer and light transmitted through the wafer and reflected from the lower surface of the wafer, as described above, is used to accurately measure the thickness or the height of the wafer for the purpose of positioning the focal point at a certain depth position from the upper surface (refer to, for example, Japanese Patent Laid-open No. 2011-122894).

SUMMARY OF THE INVENTION

Incidentally, the non-contact type measuring unit adopted in the technologies described in Japanese Patent Laid-open No. 2012-021916 and Japanese Patent Laid-open No. 2011-122894 is configured to spectrally disperse, by a diffraction grating, the return lights reflected at the upper surface and the lower surface of the wafer when light is applied to the wafer, to obtain a spectral interference waveform, and configured to calculate (Fourier transform) the light intensity for each wavelength, thereby detecting the thickness or the height of the wafer, so that there is a problem that the thickness in a desired region of the wafer cannot be measured in a short period of time.

Accordingly, it is an object of the present invention to provide a measuring apparatus that is capable of measuring the thickness or the height of a plate-shaped workpiece in a short period of time.

In accordance with an aspect of the present invention, there is provided a measuring apparatus for measuring a thickness or a height of a plate-shaped workpiece. The measuring apparatus includes a chuck table that holds the plate-shaped workpiece and a measuring unit that measures the thickness or the height of the plate-shaped workpiece held by the chuck table. The measuring unit includes a light source that emits light in a predetermined wavelength region, a condenser lens that applies the light emitted by the light source, to the plate-shaped workpiece held by the chuck table, a collimating lens that forms return light reflected by the plate-shaped workpiece into parallel light, a transmission filter that transmits interference light of the return light formed into the parallel light, a sensor that has coordinates for receiving the interference light transmitted through the transmission filter and detecting light intensity, and a controller that determines a coordinate position at which the light intensity detected by the sensor is high, as the thickness or the height of the plate-shaped workpiece.

Preferably, the light emitted by the light source is guided to the condenser lens by a first optical fiber, the return light is guided to the collimating lens by a second optical fiber, and the first optical fiber and the second optical fiber are connected to each other by an optical circulator. Preferably, the thickness of the plate-shaped workpiece is measured according to interference light of the return light reflected by an upper surface of the plate-shaped workpiece and the return light reflected by a lower surface of the plate-shaped workpiece. Preferably, a height of an upper surface of the plate-shaped workpiece is measured according to interference light of reference light having a specified optical path length and the return light reflected by the upper surface of the plate-shaped workpiece, a height of a lower surface of the plate-shaped workpiece is measured according to interference light of the reference light and the return light reflected by the lower surface of the plate-shaped workpiece, and the thickness of the plate-shaped workpiece is measured according to a difference between the height of the upper surface of the plate-shaped workpiece and the height of the lower surface of the plate-shaped workpiece.

According to the present invention, the thickness of a plate-shaped workpiece can be measured in a short period of time, without the need to spectrally disperse the return light by a diffraction grating and to calculate the light intensity for each wavelength in order to measure the thickness of the plate-shaped workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
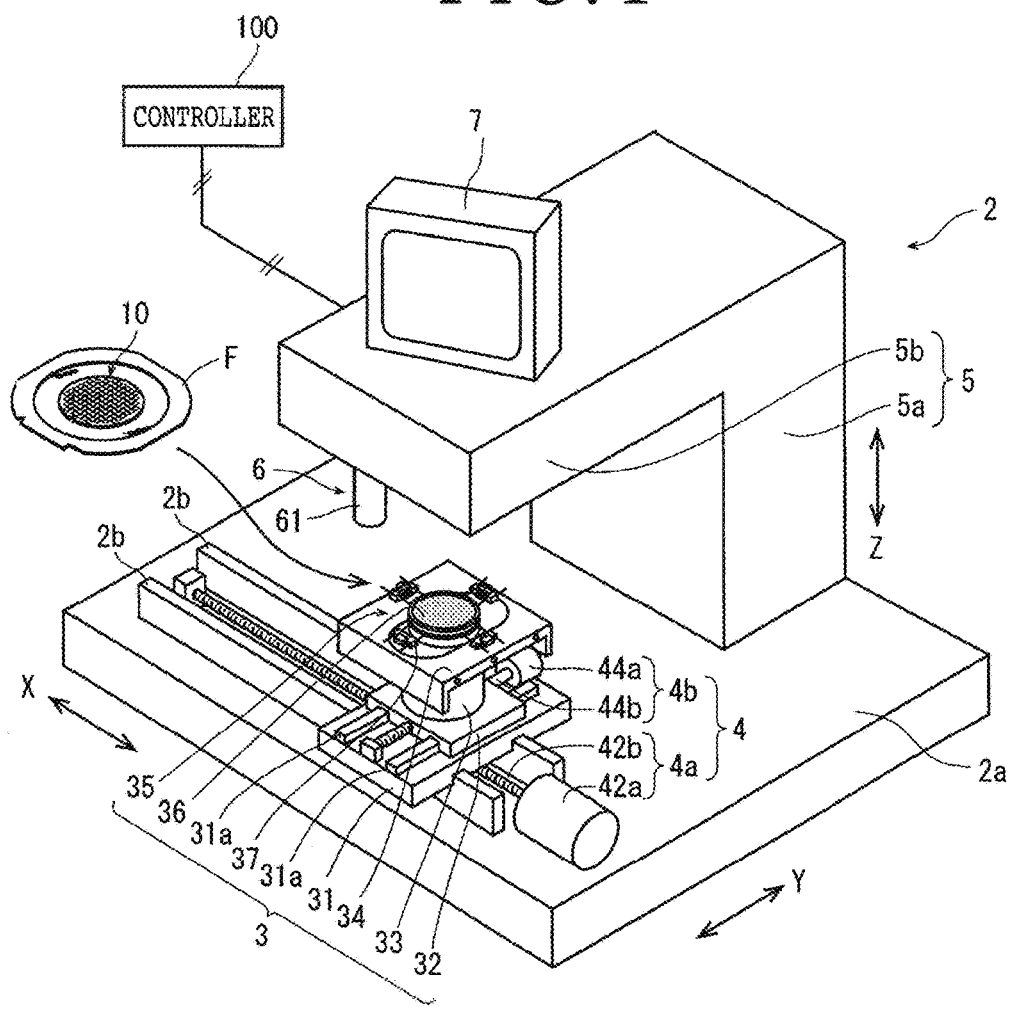
FIG. 1 is a perspective view of the whole part of a measuring apparatus.

A measuring apparatus according to an embodiment of the present invention will be described in detail below with reference to the attached drawings. FIG. 1 depicts a perspective view of the whole part of a measuring apparatus 2 of the embodiment of the present invention. The measuring apparatus 2 includes at least a holding unit 3 that holds a wafer 10 which is a kind of a plate-shaped workpiece as an object of measurement disposed on a base 2a and a measuring unit 6 that measures the thickness of the wafer 10 held by the holding unit 3. In addition, the measuring apparatus 2 of the present embodiment includes a moving mechanism 4 that moves the holding unit 3 in an X-axis direction and a Y-axis direction and a frame 5 that includes a vertical wall section 5a erected on a lateral side of the moving mechanism 4 and a horizontal wall section 5b extending in a horizontal direction from an upper end part of the vertical wall section 5a. An optical system (detailed later) of the measuring unit 6 is accommodated in the inside of the horizontal wall section 5b.

As depicted in FIG. 1, the holding unit 3 includes a rectangular X-axis direction movable plate 31 mounted on the base 2a movably in the X-axis direction, a rectangular Y-axis direction movable plate 32 mounted on the X-axis direction movable plate 31 movably in the Y-axis direction, a cylindrical support column 33 fixed to an upper surface of the Y-axis direction movable plate 32, and a rectangular cover plate 34 fixed to an upper end of the support column 33. A chuck table 35 extending upward through a slot formed on the cover plate 34 is disposed on the cover plate 34. The chuck table 35 is means for holding the wafer 10 on a holding surface which is an XY plane defined by X coordinates and Y coordinates, and is configured to be rotatable by an unillustrated rotational drive mechanism accommodated in the support column 33. The holding surface of the chuck table 35 includes a suction chuck 36 formed from a gas-permeable porous material. The suction chuck 36 is connected to unillustrated suction means through a flow channel passing through the support column 33, and four clamps 37 that hold an annular frame F when the wafer 10 described later is held on the chuck table 35 are disposed at regular intervals in the periphery of the suction chuck 36.

The moving mechanism 4 includes an X-axis moving mechanism 4a that moves the above-mentioned chuck table 35 in the X-axis direction and a Y-axis moving mechanism 4b that moves the chuck table 35 in the Y-axis direction. The X-axis moving mechanism 4a converts a rotational motion of a motor 42a into a rectilinear motion and transmits the rectilinear motion to the X-axis direction movable plate 31 through a ball screw 42b, whereby the X-axis direction movable plate 31 is moved in the X-axis direction along a pair of guide rails 2b disposed along the X-axis direction on the base 2a. The Y-axis moving mechanism 4b converts a rotational motion of a motor 44a into a rectilinear motion and transmits the rectilinear motion to the Y-axis direction movable plate 32 through a ball screw 44b, whereby the Y-axis direction movable plate 32 is moved in the Y-axis direction along a pair of guide rails 31a disposed along the Y-axis direction on the X-axis direction movable plate 31.

Figure 2:
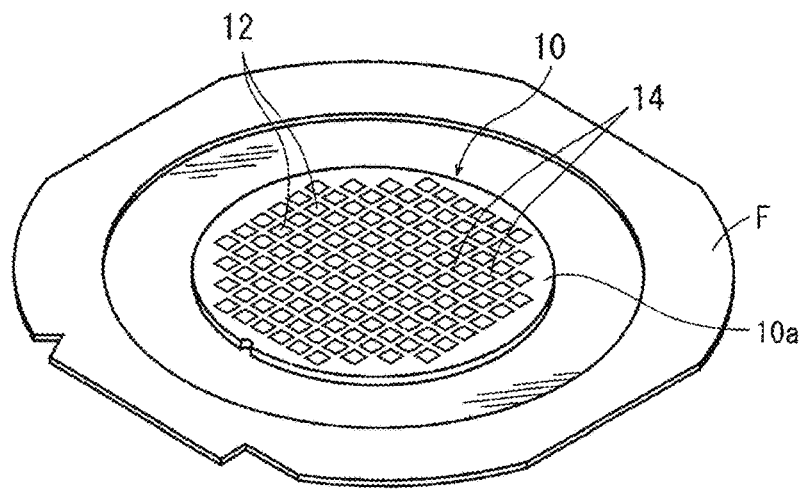
FIG. 2 is a perspective view of a wafer which is an object to be measured.

FIG. 2 illustrates the wafer 10 which is a plate-shaped workpiece whose thickness is to be measured by the measuring unit 6 of the present embodiment. The wafer 10 is, for example, a sapphire ($Al_2O_3$) substrate formed on its front surface 10a with a plurality of devices 12 partitioned by a plurality of intersecting streets 14. The device 12 is, for example, an optical device such as a light emitting diode (LED).

Figure 3:
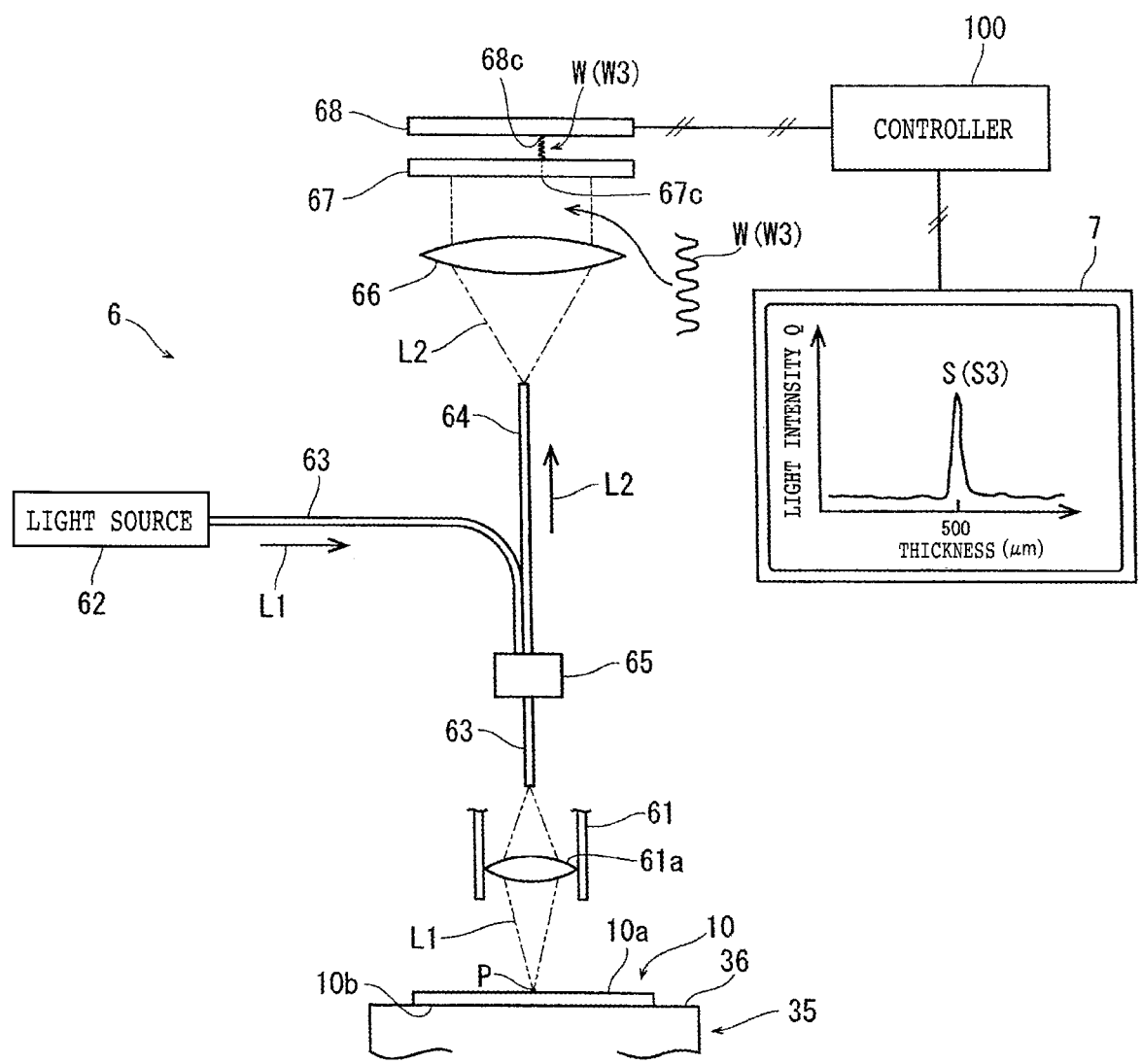
FIG. 3 is a block diagram depicting an optical system of a measuring unit mounted to the measuring apparatus of FIG. 1.

FIG. 3 is a block diagram depicting the outline of the optical system of the measuring unit 6 of the present embodiment. The measuring unit 6 includes a light source 62 that emits light L1 in a predetermined wide wavelength region, a light concentrating unit 61 including a condenser lens 61a that applies the light L1 emitted by the light source 62, to the wafer 10 held by the chuck table 35 of the holding unit 3, a collimating lens 66 that forms return light L2 which is reflected by the wafer 10 and which goes backward, into parallel light, a transmission filter 67 that transmits interference light W constituting the return light L2 formed into the parallel light, and a sensor 68 including coordinates for receiving the interference light W transmitted through the transmission filter 67 and detecting light intensity Q. A controller 100 measures, as the thickness (or the height) of the wafer 10, the coordinate position at which the light intensity Q detected by the sensor 68 is high, and displays the measurement result on a monitor 7.

As the light source 62, for example, a light source capable of emitting light L1 with a wavelength in a region of 1,280 to 1,360 nm can be adopted. For example, such a light source can be selected from LED, superluminescent diode (SLD), and super continuum (SC) light sources and the like.

Figure 4:
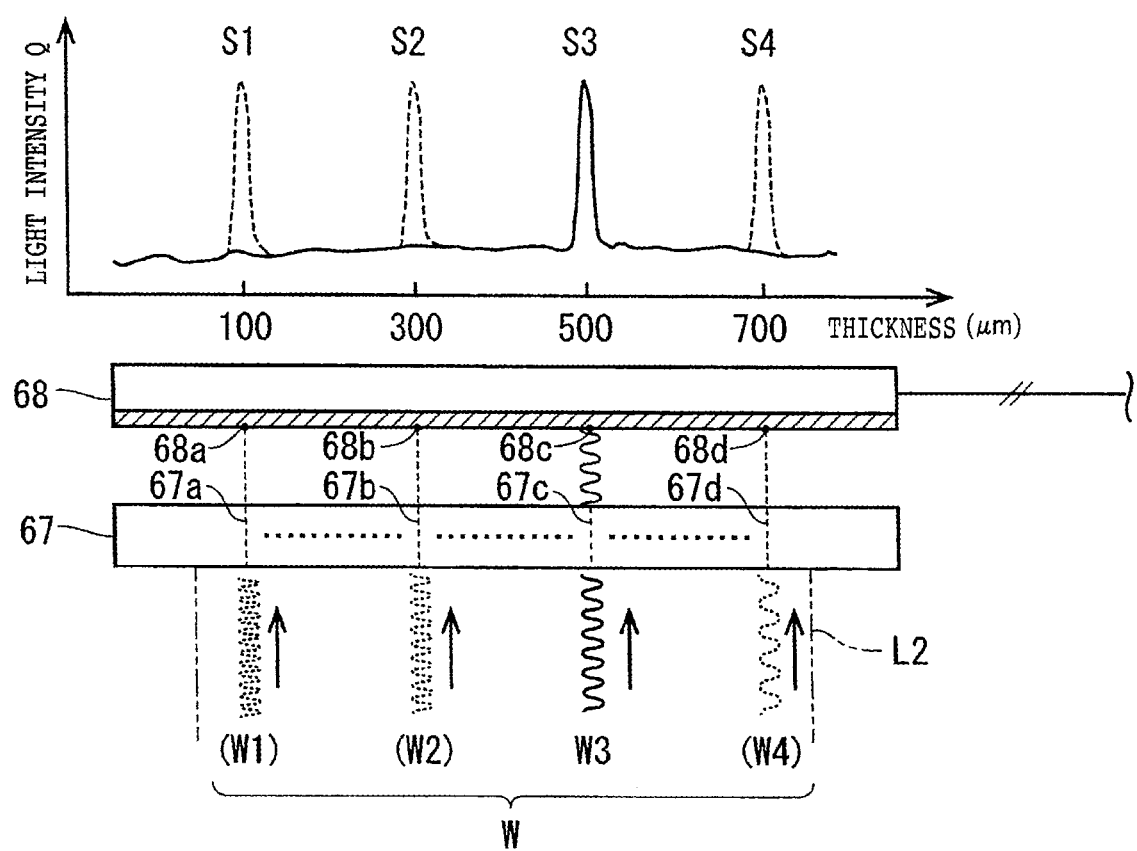
FIG. 4 is a conceptual diagram depicting functions of a transmission filter and a sensor of the measuring unit of FIG. 3.

The transmission filter 67 is what is generally called a density conversion filter known as a frequency filter which uses Fourier transform. The transmission filter 67 is a filter that transmits the interference light W constituting the return light L2, and, as depicted in FIG. 4, is composed of a transmission film produced with such a design that the transmission position varies according to interference light W1 to interference light W4 varying in correspondence with the thickness of the wafer 10. More specifically, for example, as understood from FIG. 4, the return light L2 reflected by the upper surface and the lower surface of the wafer 10 in a case where the thickness of the wafer 10 is 100 µm is constituted of the interference light W1, and the interference light W1 is well transmitted only through a position 67a of the transmission filter 67 but is little transmitted through the other positions. In addition, the interference light W2 constituting the return light L2 in a case where the thickness of the wafer 10 is 300 µm is well transmitted only through a position 67b of the transmission filter 67 but is little transmitted through the other positions. Similarly, the interference light W3 constituting the return light L2 in a case where the thickness of the wafer 10 is 500 µm is well transmitted only through a position 67c of the transmission filter 67 but is little transmitted through the other positions. Further, the interference light W4 constituting the return light L2 in a case where the thickness of the wafer 10 is 700 µm is well transmitted only through a position 67d of the transmission filter 67 but is little transmitted through the other positions.

Note that, in the embodiment depicted in FIGS. 3 and 4, the case where the return light L2 is constituted of the interference light W3 (represented by solid line) is depicted, and the interference light W1, the interference light W2, and the interference light W4 are represented by broken lines. In addition, in the embodiment of FIG. 4, only examples in which four kinds of the interference light W1 to the interference light W4 are transmitted through the corresponding positions 67a to 67d of the transmission filter 67 are depicted as typical examples for convenience of description, but a practical transmission filter 67 is produced with such a design that the transmission position varies in correspondence with the respective ones of the interference light W formed in a case where the thickness of the wafer 10 varies between 100 and 800 µm.

Here, in the above-mentioned sensor 68, one of the interference light W1 to the interference light W4 transmitted through the transmission filter 67 is detected, and peaks S1 to S4 where the light intensity Q is high appear at coordinate positions according to the detected interference light W1 to interference light W4. Since, as described above, the coordinate positions of the peaks S1 to S4 detected by the sensor 68 are stored in the controller 100 in such a manner as to correspond to the thickness (or the height) of the wafer 10, it is possible to measure the thickness of the wafer 10 on the basis of coordinate positions 68a to 68d where the peaks S1 to S4 appear, as depicted on the monitor 7.

At the time of measuring the thickness of the wafer 10 by the measuring unit 6 of the above-mentioned embodiment, the wafer 10 depicted in FIG. 2 is mounted on the chuck table 35 and is held under suction thereon. Next, the moving mechanism 4 is operated to position the wafer 10 directly under the light concentrating unit 61. Note that, before the wafer 10 is positioned directly under the light concentrating unit 61, the position to be measured (for example, a measurement position P on the street 14) of the wafer 10 may be imaged by an unillustrated imaging unit, measurement position information may be stored in the controller 100, and the wafer 10 may be positioned directly under the light concentrating unit 61 on the basis of the measurement position information. In the present embodiment, the light L1 emitted by the light source 62 is guided by a first optical fiber 63 to the condenser lens 61a of the light concentrating unit 61, and is applied to the measurement position P of the wafer 10. The light L1 applied to the wafer 1 is reflected by the upper surface (front surface 10a) and the lower surface (back surface 10b) of the wafer 10, and the thus reflected return light L2 passes through the first optical fiber 63, is guided by an optical circulator 65 to a second optical fiber 64 to reach the collimating lens 66, and is applied to the transmission filter 67.

Here, as described based on FIGS. 3 and 4, in the case where the return light L2 is constituted of the interference light W3, the interference light W3 is well transmitted through the position 67c of the transmission filter 67 but is little transmitted through the other positions. Hence, a peak S3 with a high light intensity Q appears at the coordinate position 68c of the sensor 68 corresponding to the position 67c, and the thickness (500 µm) corresponding to the coordinate position 68c where the peak S3 is detected is measured. The thickness (500 µm) thus measured is stored in the controller 100 in correspondence with the XY coordinates specifying the above-mentioned measurement position P. When the thickness at the measurement position P has been measured, if required, the above-mentioned moving mechanism 4 is operated to move the measurement position P on the wafer, and the thicknesses at other positions are also appropriately measured and stored in the controller 100.

According to the above-described embodiment, the thickness of a plate-shaped workpiece can be measured in a short period of time, without the need to spectrally disperse the return light L2 by a diffraction grating and subject the light intensity for each wavelength to Fourier transform or the like, as in the prior art, in order to measure the thickness of the plate-shaped workpiece. In addition, with the thickness of the plate-shaped workpiece easily and efficiently measured as described above, it is possible to enhance efficiency of laser processing and grinding.

Figure 5:
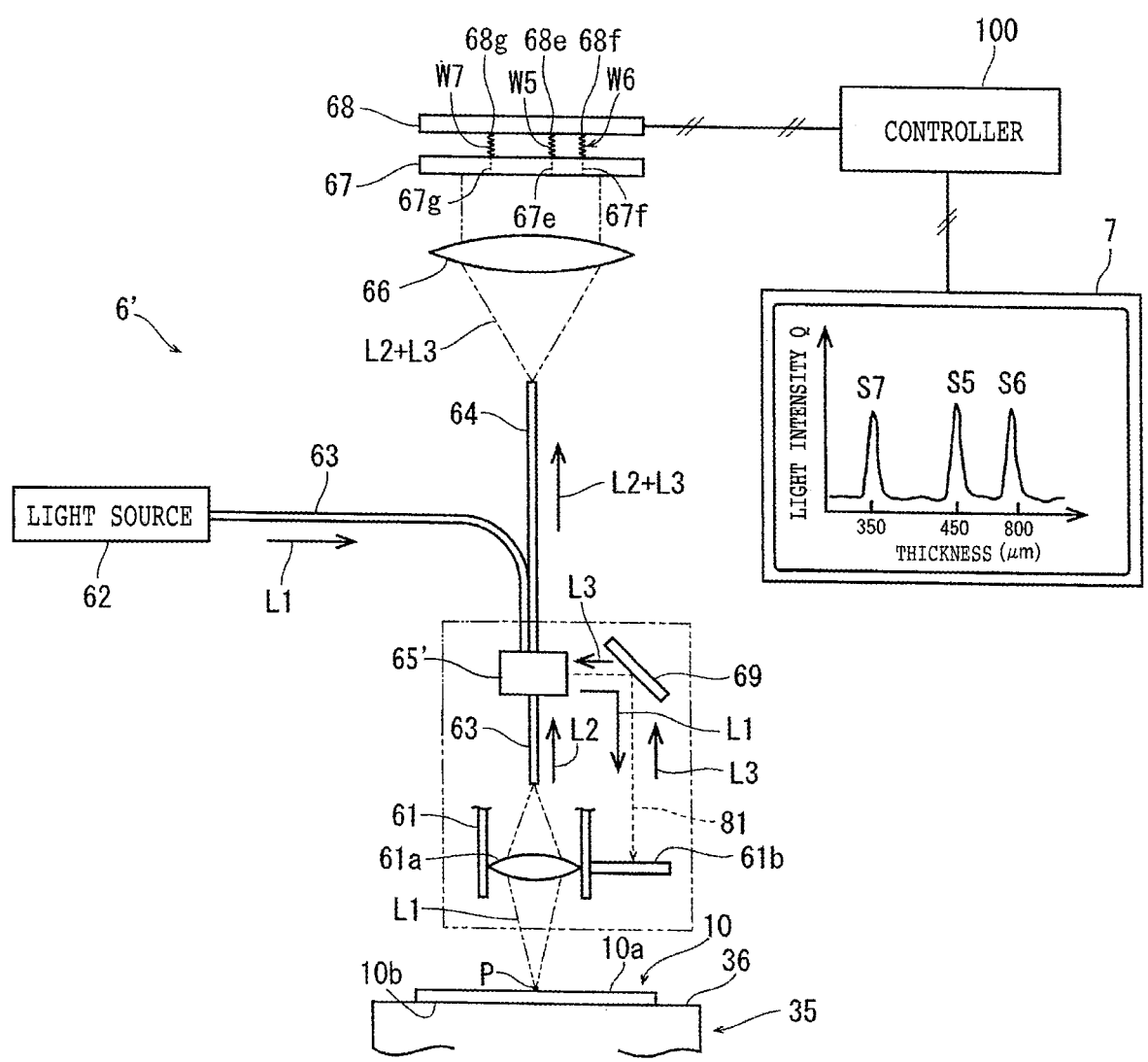
FIG. 5 is a block diagram depicting another embodiment of the measuring unit depicted in FIG. 3.

The present invention is not limited to the measuring apparatus 2 of the above-described embodiment. FIG. 5 illustrates a measuring unit 6' of another embodiment of the measuring unit 6 disposed in the above-mentioned measuring apparatus 2. Note that the measuring unit 6 and the measuring unit 6' are substantially the same in configuration, the same members are denoted by the same numbers, and newly added members are denoted by new numbers.

The measuring unit 6' in the embodiment depicted in FIG. 5 includes a light source 62 similar to that of the measuring unit 6, the light L1 emitted by the light source 62 is guided by the first optical fiber 63 to the condenser lens 61a, the return light L2 is guided by the second optical fiber 64 to the collimating lens 66, and the first optical fiber 63 and the second optical fiber 64 are connected to an optical circulator 65'. The optical circulator 65' of the present embodiment branches the light L1 into an optical path 81 different from the first optical fiber 63 and the second optical fiber 64, and the light L1 guided into the optical path 81 is changed in optical path by a reflection mirror 69, and is guided to a reflection mirror 61b fixed to the light concentrating unit 61. The return light L3 reflected by the reflection mirror 61b is guided by the optical circulator 65' into the second optical fiber 64, and is applied to the transmission filter 67 through the collimating lens 66 together with the above-mentioned return light L2.

As understood from FIG. 5, the optical path length from the optical circulator 65' to the reflection mirror 61b is not influenced by the thickness of the wafer 10, and is a specified value which does not vary regardless of the position where the light concentrating unit 61 is located. The return light L3 that is reflected at the reflection mirror 61b and goes backward will hereinbelow be referred to as reference light L3. Note that the optical path length from the optical circulator 65' to the reflection mirror 61b is set to be shorter than the optical path length from the optical circulator 65' to the surface of the suction chuck 36 of the chuck table 35. In the present embodiment, the optical path length from the optical circulator 65' to the reflection mirror 61b is set to be shorter than the optical path length from the optical circulator 65' to the surface of the suction chuck 36 of the chuck table 35 by, for example, 1,000 µm.

In the above-described measuring unit 6', the light L1 emitted by the light source 62 is guided to the condenser lens 61a by the first optical fiber 63, and is branched at the optical circulator 65', to be guided to the reflection mirror 61b through the reflection mirror 69. The light L1 is applied to the wafer 10 through the condenser lens 61a, and the return light L2 including the reflected light reflected by the front surface 10a and the back surface 10b and the reference light L3 reflected by the reflection mirror 61b form return light L2+L3, which goes through the optical circulator 65' and is applied to the transmission filter 67 through the second optical fiber 64 and the collimating lens 66.

As described above, the transmission filter 67 is a filter which is set to transmit the interference light constituting the return light L2+L3, with the transmission position varied according to the interference light varying in correspondence with the thickness and height of the wafer 10, and, by the sensor 68, the coordinate position where the peak with a high light intensity Q transmitted through the transmission filter 67 and applied appears can be specified. The controller 100 measures the heights of the upper surface (front surface 10a) and the lower surface (back surface 10b) of the wafer 10 and the thickness of the wafer 10 on the basis of the coordinate position. More specifically, as depicted in FIG. 5, interference light W5 of the reference light L3 contained in the return light L2+L3 and the return light reflected by the front surface 10a of the wafer 10 is transmitted through a predetermined position 67e of the transmission filter 67, to cause a peak S5 with a high light intensity Q to appear at the coordinate position 68e of the sensor 68, and the height of the front surface 10a of the wafer 10 is measured to be 450 μm on the basis of the coordinate position 68e where the peak S5 is detected.

Simultaneously, interference light W6 of the reference light L3 and the return light reflected by the back surface 10b of the wafer 10 is transmitted through a predetermined position 67f of the transmission filter 67, to cause a peak S6 with a high light intensity Q to appear at a coordinate position 68f of the sensor 68, and, on the basis of the coordinate position 68f where the peak S6 is detected, the height of the back surface 10b of the wafer 10 is measured to be 800 μm. Note that the above-mentioned heights are based on the optical path length of the reference light L3, and are respectively the difference between the optical path length of the reference light L3 and the optical path length from the optical circulator 65' to the front surface 10a and the difference between the optical path length of the reference light L3 and the optical path length from the optical circulator 65' to the back surface 10b. Since the optical path length from the optical circulator 65' to the reflection mirror 61b is set to be shorter than the optical path length from the optical circulator 65' to the surface of the suction chuck 36 of the chuck table 35 by 1,000 μm, a height value (450 μm) of the front surface 10a of the wafer 10 is smaller than a height value (800 μm) of the back surface 10b.

In the above-described embodiment, the height value (450 μm) of the front surface 10a of the wafer 10 and the height value (800 μm) of the back surface 10b are measured, and hence, by calculation of the difference therebetween, the thickness at the measurement position P of the wafer 10 is calculated (350 μm). Note that, as described above, the return light L2 contains the reflected lights reflected at the front surface 10a and the back surface 10b of the wafer 10, interference light W7 constituting the reflected lights is transmitted through a predetermined position 67g of the transmission filter 67, and hence, a peak S7 with a high light intensity Q is detected at a coordinate position 68g of the sensor 68. Then, with reference to a table stored in the controller 100 mentioned above, the thickness corresponding to the coordinate position 68g where the peak S7 is detected is measured to be 350 μm. Note that, in the above embodiment, the light L1 has been described as light which is transmitted through the wafer 10, but according to the configuration in which the difference between the optical path length of the reference light L3 having a specified optical path length and the optical path length of the reflected light reflected in the wafer 10 is measured, like the above-mentioned measuring unit 6', the height of the front surface 10a of the wafer 10 can accurately be measured even if the wafer 10 does not transmit the light L1.

According to the above-mentioned measuring unit 6', by use of the reference light L3 having a specified optical path length, the height based on the difference between the optical path length of the reference light L3 and the optical path length of the return light L2 reflected in the wafer 10 is easily measured, and hence, the height and thickness of the wafer 10 can be measured in a short period of time, without performing calculation (Fourier transform) of the light intensity for each of wavelengths spectrally dispersed by a diffraction grating.

In the above embodiment, the measuring apparatus 2 has been described exclusively as an apparatus for measuring the thickness or the height of a wafer, but the present invention is not limited to this, and the measuring apparatus 2 may be disposed in a processing apparatus for processing a plate-shaped workpiece, for example, in a laser processing apparatus that applies a laser beam of such a wavelength as to be transmitted through a plate-shaped workpiece, with a focal point of the laser beam positioned inside the plate-shaped workpiece, to form modified layers in the inside of the plate-shaped workpiece as starting points of division.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A measuring apparatus for measuring a thickness or a height of a plate-shaped workpiece, the measuring apparatus comprising:
   a chuck table that holds the plate-shaped workpiece; and
   a measuring unit that measures the thickness or the height of the plate-shaped workpiece held by the chuck table,
   wherein the measuring unit includes
      a light source that emits light in a predetermined wavelength region,
      a condenser lens that applies the light emitted by the light source, to the plate-shaped workpiece held by the chuck table,
      a collimating lens that forms return light reflected by the plate-shaped workpiece into parallel light,
      a transmission filter that transmits interference light of the return light formed into the parallel light,
      a sensor that has coordinates for receiving the interference light transmitted through the transmission filter and detecting light intensity, and
      a controller that determines a coordinate position at which the light intensity detected by the sensor is high, as the thickness or the height of the plate-shaped workpiece.

2. The measuring apparatus according to claim 1, wherein the light emitted by the light source is guided to the condenser lens by a first optical fiber, the return light is guided to the collimating lens by a second optical fiber, and the first optical fiber and the second optical fiber are connected to each other by an optical circulator.

3. The measuring apparatus according to claim 1, wherein the thickness of the plate-shaped workpiece is measured according to interference light of the return light reflected by an upper surface of the plate-shaped workpiece and the return light reflected by a lower surface of the plate-shaped workpiece.

4. The measuring apparatus according to claim 1, wherein a height of an upper surface of the plate-shaped workpiece is measured according to interference light of reference light having a specified optical path length and the return light reflected by the upper surface of the plate-shaped workpiece, a height of a lower surface of the plate-shaped workpiece is measured according to interference light of the reference light and the return light reflected by the lower surface of the plate-shaped workpiece, and the thickness of the plate-shaped workpiece is measured according to a difference between the height of the upper surface of the plate-shaped workpiece and the height of the lower surface of the plate-shaped workpiece.

\* \* \* \* \*